(12) United States Patent
Minoshima et al.

(10) Patent No.: US 12,041,726 B2
(45) Date of Patent: Jul. 16, 2024

(54) MANAGEMENT DEVICE, MOVING WORK DEVICE, MOUNTING DEVICE, MOUNTING SYSTEM, AND MANAGEMENT METHOD

(71) Applicant: FUJI CORPORATION, Chiryu (JP)

(72) Inventors: Nobuaki Minoshima, Tougou-cho (JP); Kenji Hara, Kariya (JP); Shinji Naito, Anjo (JP)

(73) Assignee: FUJI CORPORATION, Chiryu (JP)

( * ) Notice: Subject to any disclaimer, the term of this patent is extended or adjusted under 35 U.S.C. 154(b) by 496 days.

(21) Appl. No.: 17/420,843

(22) PCT Filed: Feb. 6, 2019

(86) PCT No.: PCT/JP2019/004258
§ 371 (c)(1),
(2) Date: Jul. 6, 2021

(87) PCT Pub. No.: WO2020/161830
PCT Pub. Date: Aug. 13, 2020

(65) Prior Publication Data
US 2022/0087087 A1    Mar. 17, 2022

(51) Int. Cl.
*G05B 19/4097* (2006.01)
*H05K 13/08* (2006.01)

(52) U.S. Cl.
CPC ..... *H05K 13/0882* (2018.08); *G05B 19/4097* (2013.01); *H05K 13/086* (2018.08); *G05B 2219/45031* (2013.01)

(58) Field of Classification Search
CPC ............. H05K 13/0882; H05K 13/086; H05K 13/021; H05K 13/0857; H05K 13/0417; G05B 19/4097; G05B 2219/45031
See application file for complete search history.

(56) References Cited

U.S. PATENT DOCUMENTS

2018/0242485 A1* 8/2018 Kondo ............... H05K 13/0473
2018/0376635 A1* 12/2018 Iisaka ............... H05K 13/0417

FOREIGN PATENT DOCUMENTS

| EP | 3 190 864 A1 | 7/2017 | |
|---|---|---|---|
| EP | 3 379 910 A1 | 9/2018 | |
| JP | 2018/008148 A1 | 4/2019 | |
| WO | WO-2017033268 A1 * | 3/2017 | ........... H05K 13/021 |
| WO | WO 2017/085782 A1 | 5/2017 | |
| WO | WO-2017085782 A1 * | 5/2017 | ......... H05K 13/0417 |

OTHER PUBLICATIONS

International Search Report issued on Apr. 23, 2019 in PCT/JP2019/004258 filed on Feb. 6, 2019, 2 pages.

* cited by examiner

*Primary Examiner* — Yuhui R Pan
(74) *Attorney, Agent, or Firm* — Oblon, McClelland, Maier & Neustadt, L.L.P.

(57) ABSTRACT

The management device includes a management control section configured to set attachment position setting information including an attachment position of a feeder in a tendency such that the feeder is to be replaced in association with production switching to be attached to an attachment portion closer to a storage section based on production plan information including multiple pieces of mounting condition information.

5 Claims, 5 Drawing Sheets

Fig. 4
Fig.4A  Fig.4B  Fig.4C
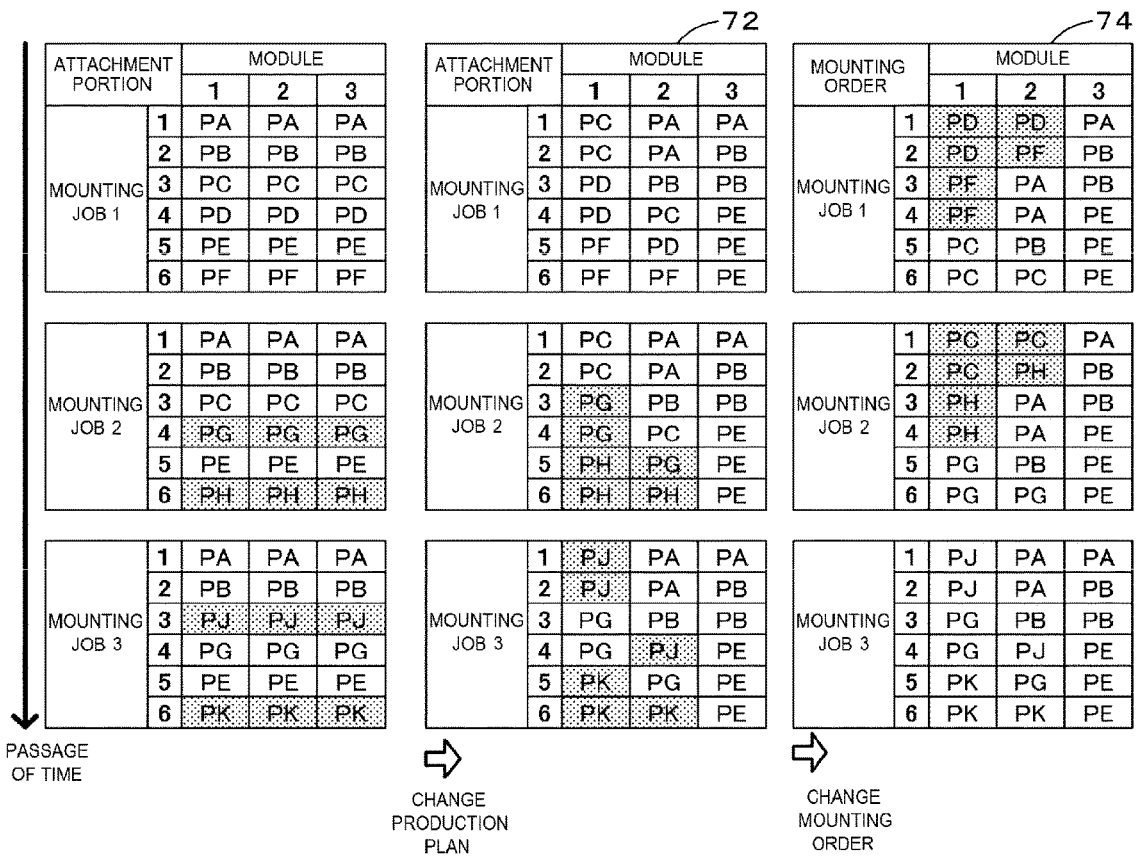
PASSAGE OF TIME
CHANGE PRODUCTION PLAN
CHANGE MOUNTING ORDER
Fig. 5
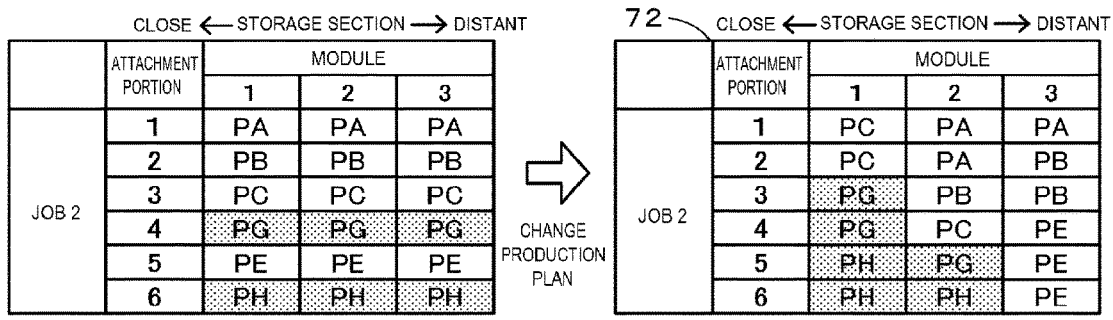
CHANGE PRODUCTION PLAN

MANAGEMENT DEVICE, MOVING WORK DEVICE, MOUNTING DEVICE, MOUNTING SYSTEM, AND MANAGEMENT METHOD

TECHNICAL FIELD

The present specification discloses a management device, a moving work device, a mounting device, a mounting system, and a management method.

BACKGROUND ART

Conventionally, a mounting system has been proposed in which a feeder storage is disposed in a production line and which includes a replacement robot (moving work device) that is moved between a mounting device and the feeder storage to exchange feeders. As such a mounting system, for example, a mounting system has been proposed in which a mounting process is performed while a moving work device replaces a component supply unit in which an accommodated component remains among multiple component supply units set in a mounting device during a mounting process for one board with another component supply unit (refer to Patent Literature 1, for example). In this mounting system, it is possible to easily realize replacement of a component supply unit for improving the productivity in a mounting process during the mounting process on one board by using the moving work device.

PATENT LITERATURE

Patent Literature 1: International Publication No. WO2017/085782

BRIEF SUMMARY

Technical Problem

Meanwhile, in a mounting system, for example, when a production schedule for multiple types of boards is executed, there is a case where a setup changing operation for replacing a feeder may be performed when switching to the next production. Even in the mounting system in Patent Literature 1, the setup changing operation may be performed by using a moving work device, but the setup changing operation is not particularly considered. In a mounting system, it is desirable to switch productions with higher efficiency.

A principal object of the present disclosure is to provide a management device, a moving work device, a mounting device, a mounting system, and a management method capable of performing a setup changing operation associated with production switching with higher efficiency.

The present disclosure employs the following means in order to achieve the above principal object.

A management device of the present disclosure that is used in a mounting system including a mounting device including a mounting section configured to mount a component on a mounting target, a supply section having an attachment portion to which a feeder holding the component is attached, and a mounting control section configured to cause the mounting section to pick up the component from the feeder based on mounting condition information, and a moving work device including a movement control section configured to recover the feeder from the supply section or provide the feeder to the supply section and move the feeder to and from a storage section, the management device including a management control section configured to set attachment position setting information including an attachment position of the feeder in a tendency for the feeder to be replaced in association with production switching to be attached to an attachment portion closer to the storage section based on production plan information including multiple pieces of the mounting condition information.

In this management device, the attachment position setting information including an attachment position of the feeder is set based on the production plan information including multiple pieces of mounting condition information such that a tendency for the feeder to be replaced in association with production switching to be attached to an attachment portion closer to the storage section storing the feeder is achieved. The moving work device performs an operation of moving the feeder to and from the storage section based on the attachment position setting information during production switching. In this case, since the feeder to be replaced in association with the production switching is present at a position closer to the storage section, it is possible to further shorten a movement distance of the moving work device, and thus it is possible to further reduce the time required to exchange feeders. Therefore, in the management device, it is possible to execute a setup changing operation associated with production switching with higher efficiency. Here, the "mounting target" includes, for example, a board or a substrate having a three-dimensional shape. The "tendency to be attached to a closer attachment portion" indicates that a feeder is attached to a closer attachment portion as a whole although the presence of a feeder that cannot satisfy the tendency is partially allowed. The production plan information used to set the attachment position setting information may be information in which an attachment position of the feeder, a component pickup order, and a component disposition order are not set.

BRIEF DESCRIPTION OF DRAWINGS

FIG. 4 is an explanatory diagram illustrating an example of an outline of setting of an attachment position and a pre-setup change pickup order.

FIG. 5 is an explanatory diagram illustrating an example of setting of attachment position setting information 72.

DESCRIPTION OF EMBODIMENTS

Figure 1:
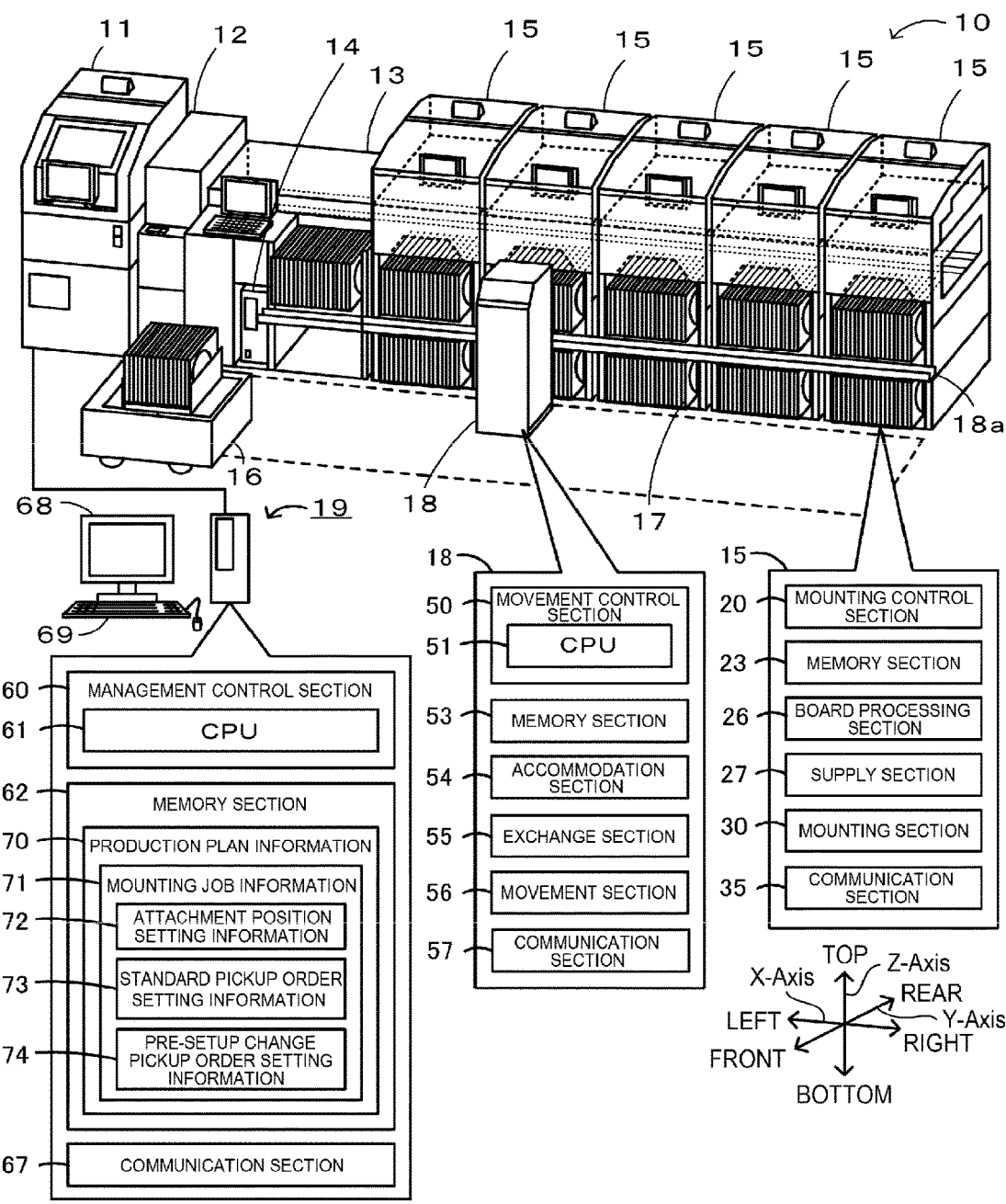
FIG. 1 is a schematic explanatory diagram illustrating an example of mounting system 10.
Figure 2:
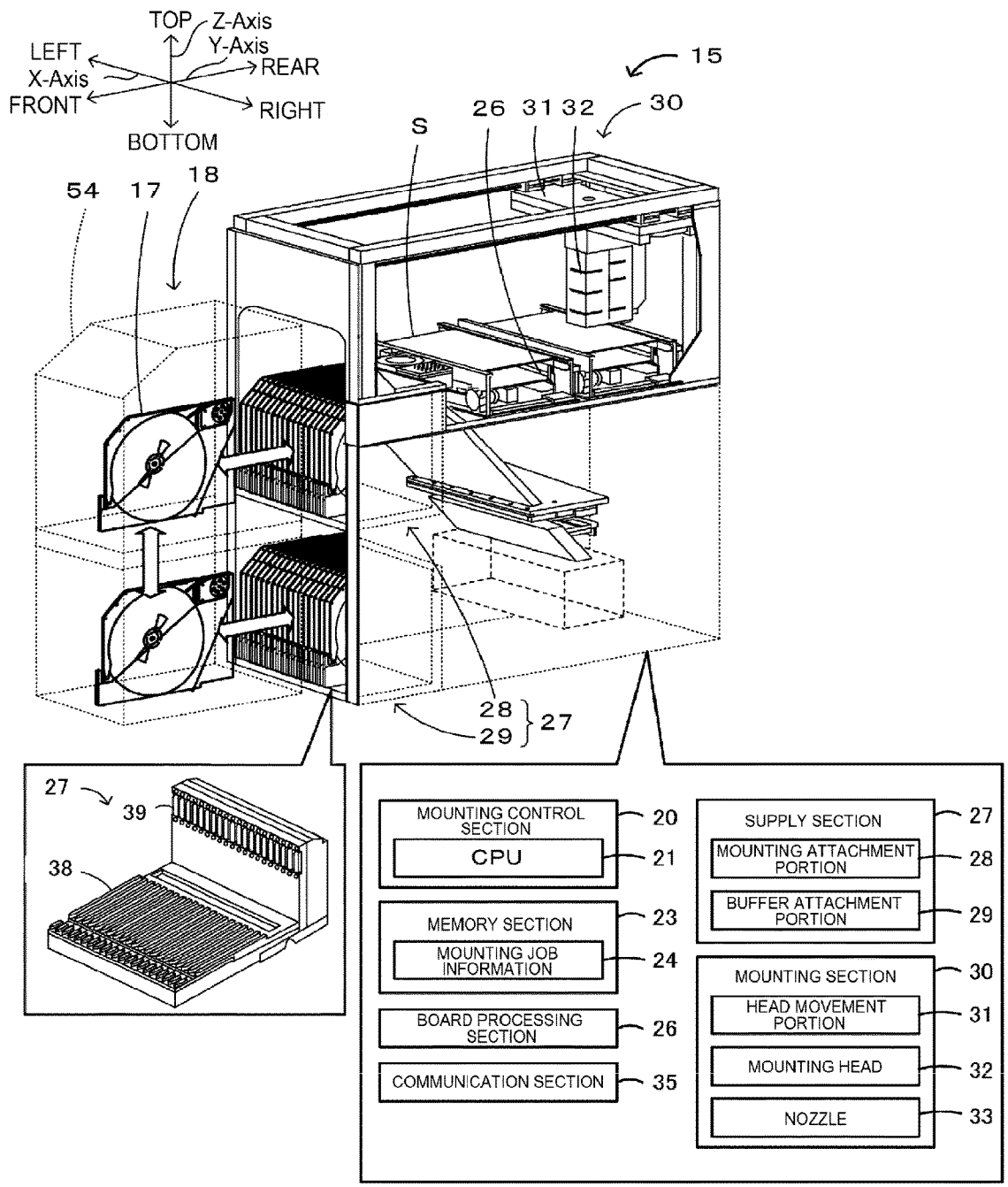
FIG. 2 is an explanatory diagram schematically illustrating configurations of mounting device 15 and loader 18.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating a configuration of mounting device 15 and loader 18 that is a moving work device. In the present embodiment, a leftward-rightward direction (X-axis), a front-rear direction (Y-axis), and an upward-downward direction (Z-axis) are as illustrated in FIGS. 1 and 2.

Mounting system 10 is configured as, for example, a production line in which mounting devices 15 that perform a mounting process for mounting components on board S that is a mounting target are arranged in a conveyance direction of board S. Here, the mounting target is described as board S, but is not particularly limited to this as long as components are mounted thereon, and a substrate having a three-dimensional shape may be used. As illustrated in FIG. 1, mounting system 10 is configured to include printing device 11, print inspection device 12, storage section 13, storage section PC 14, mounting devices 15, automatic conveyance vehicle 16, loader 18, host PC 19, and the like. Printing device 11 is a device that prints a solder paste or the like on board S. Print inspection device 12 is a device that inspects a state of the printed solder. Storage section 13 is a storage location for storing feeders 17 used in mounting device 15. Storage section 13 is provided under a conveyance device between print inspection device 12 and mounting device 15.

Mounting devices 15 are devices that pick up components and mount the components on board S. Mounting device 15 includes mounting control section 20, memory section 23, board processing section 26, supply section 27, mounting section 30, and communication section 35. Mounting control section 20 is configured as a microprocessor centered on CPU 21 and controls the entire device, as illustrated in FIG. 2. Mounting control section 20 outputs control signals to board processing section 26, supply section 27, or mounting section 30 to cause mounting section 30 to pick up the components, and receives signals from board processing section 26, supply section 27, or mounting section 30. Memory section 23 stores mounting job information 24 (mounting condition information) and the like. Mounting job information 24 is the same information as mounting job information 71 that will be described later, and includes information such as an attachment position of feeder 17 from which a component is picked up, a pickup order of the component, a disposition order in which the component is mounted on board S, and a disposition position of the component. Mounting job information 24 is created by host PC 19 according to a pickup order and a disposition order having high mounting efficiency, and is transmitted from host PC 19 to be stored into memory section 23. Communication section 35 is an interface that performs exchange of information with external devices such as storage section PC 14 and host PC 19.

Board processing section 26 is a unit that performs carrying in, conveyance, fixation of board S at a mounting position, and carrying out thereof. Board processing section 26 has a pair of conveyor belts that are provided to be spaced apart from each other in the front-rear direction and are stretched in the leftward-rightward direction in FIG. 2. Board S is conveyed by the conveyor belts. Board processing section 26 includes two pairs of the conveyor belts, and can convey and fix two boards S simultaneously.

Supply section 27 is a unit that supplies components to mounting section 30. Supply section 27 has feeders 17 each of which includes a reel around which a tape as a holding member holding a component is wound and which are attached to one or more attachment portions. As illustrated in FIG. 2, supply section 27 has two upper and lower attachment portions to which feeders 17 are attachable at the front. The upper stage is mounting attachment portion 28 from which the component can be picked up by mounting section 30, and the lower stage is buffer attachment portion 29 from which the component cannot be picked up by mounting section 30. Here, mounting attachment portion 28 and buffer attachment portion 29 are collectively referred to as attachment portions. The attachment portions are managed in the unit of a module grouped into a predetermined number (for example, four or twelve). In mounting system 10, one mounting device 15 may have one module, one mounting device 15 may have multiple modules, or multiple mounting devices 15 may have one module. Feeder 17 from which the component is picked up by mounting head 32 is attached to mounting attachment portion 28. Buffer attachment portion 29 is used in a case in which feeder 17 that is to be used next or feeder 17 which has been used is temporarily stored. Buffer attachment portion 29 is served in advance with feeder 17 for provision that is replaced due to component shortage, feeder 17 for setup change that is used in the next production, or the like. Supply section 27 has multiple slots 38 arranged in the X direction at predetermined intervals, into which rail members of feeders 17 are inserted, and connection parts 39 into which connectors provided at the distal ends of feeders 17 are inserted. Feeder 17 includes a controller (not illustrated). The controller stores information such as an ID of the tape included in feeder 17, the component type, the remaining number of components, or the like. In a case in which feeder 17 is connected to connection part 39, the controller transmits the information regarding feeder 17 to mounting control section 20.

Mounting section 30 is a unit that picks up a component from supply section 27 and disposes the component on board S fixed to board processing section 26. Mounting section 30 includes head movement portion 31, mounting head 32, and nozzle 33. Head movement portion 31 includes a slider moved by being guided by guide rails in the XY-directions, and a motor that drives the slider. Mounting head 32 picks up one or more components and is moved in the XY-directions by head movement portion 31. Mounting head 32 is detachably attached to the slider. One or more nozzles 33 are detachably attached to a lower surface of mounting head 32. Nozzle 33 picks up a component by using a negative pressure. Instead of nozzle 33, a pickup member that picks up a component may be a mechanical chuck or the like that mechanically holds a component.

Storage section PC 14 is a device that manages feeder 17, stores execution data executed by loader 18, and manages loader 18. Storage section PC 14 includes a control section, a memory section, a communication section, a display section, and an input device. The control section is configured as a microprocessor centered on a CPU, and controls the entire device. The memory section stores mounting job information or the like as information for controlling loader 18. The display section is a liquid crystal screen for displaying various information. The input device includes a keyboard, a mouse, and the like used for an operator to input various commands.

Automatic conveyance vehicle 16 automatically conveys feeder 17, a member used in mounting system 10, and the like between a warehouse (not illustrated) and storage section 13.

Loader 18 is a moving work device and is a device that is moved within a movement region in front of mounting system 10 (refer to a dotted line in FIG. 1) and automatically recovers and provides feeders 17 of mounting device 15. Loader 18 includes movement control section 50, memory section 53, accommodation section 54, exchange section 55, movement section 56, and communication section 57. Movement control section 50 is configured as a microprocessor centered on CPU 51 and controls the entire device. Movement control section 50 controls the entire device to recover feeder 17 from supply section 27 or provide feeder 17 to supply section 27 and to move feeder 17. Memory section 53 is, for example, an HDD that stores various data such as a processing program. Accommodation section 54 has an accommodation space in which feeders 17 are accommodated. Accommodation section 54 is configured to be able to accommodate, for example, four feeders 17. Exchange section 55 is a mechanism that carries feeder 17 in and out and moves feeder 17 to upper and lower stages (refer to FIG. 2). Exchange section 55 has a clamp portion that clamps feeder 17, a Y-axis slider that moves the clamp portion in the Y-axis direction (front-rear direction), and a Z-axis slider that moves the clamp portion in the Z-axis direction (upward-downward direction). Exchange section 55 performs attachment and detachment of feeder 17 in mounting attachment portion 28 and attachment and detachment of feeder 17 in buffer attachment portion 29. Movement section 56 is a mechanism that moves loader 18 in the X-axis direction (leftward-rightward direction) along X-axis rail 18a disposed in front of mounting device 15. Communication section 57 is an interface that performs exchange of information with external devices such as storage section PC 14 and mounting device 15. Loader 18 outputs the current position and executed operation details to storage section PC 14.

Host PC 19 (refer to FIG. 1) is configured as a management device that creates and manages information regarding each device in mounting system 10. Host PC 19 includes management control section 60 controlling the entire device, memory section 63 storing various information, communication section 67 performing bidirectional communication with external devices such as storage section PC 14, the mounting device, automatic conveyance vehicle 16, and loader 18, display section 68 displaying a screen, and input device 69 inputting various commands. Memory section 63 stores production plan information 70 and the like. Production plan information 70 includes, for example, overall mounting job information 71 for manufacturing board S in mounting system 10 serving as the production line. Production plan information 70 includes the order of mounting jobs to be executed, details of the mounting jobs, and the like. Mounting job information 71 is the same as mounting job information 24, and includes attachment position setting information 72, standard pickup order setting information 73, pre-setup change pickup order setting information 74, and the like. Attachment position setting information 72 includes information regarding an attachment position of feeder 17 from which a component is picked up. Standard pickup order setting information 73 includes commonly used information such as a component pickup order, a disposition order in which components are mounted on board S, and a disposition position of a component. Pre-setup change pickup order setting information 74 is information used before a setup changing operation performed during production switching, that is, at the time of mounting on a last board, and includes information such as a component pickup order, a disposition order in which components are mounted on board S, and a disposition position of a component. Host PC 19 not only creates and manages mounting job information 71 used for a component mounting process but also acquires and manages information regarding mounting system 10.

Figure 3:
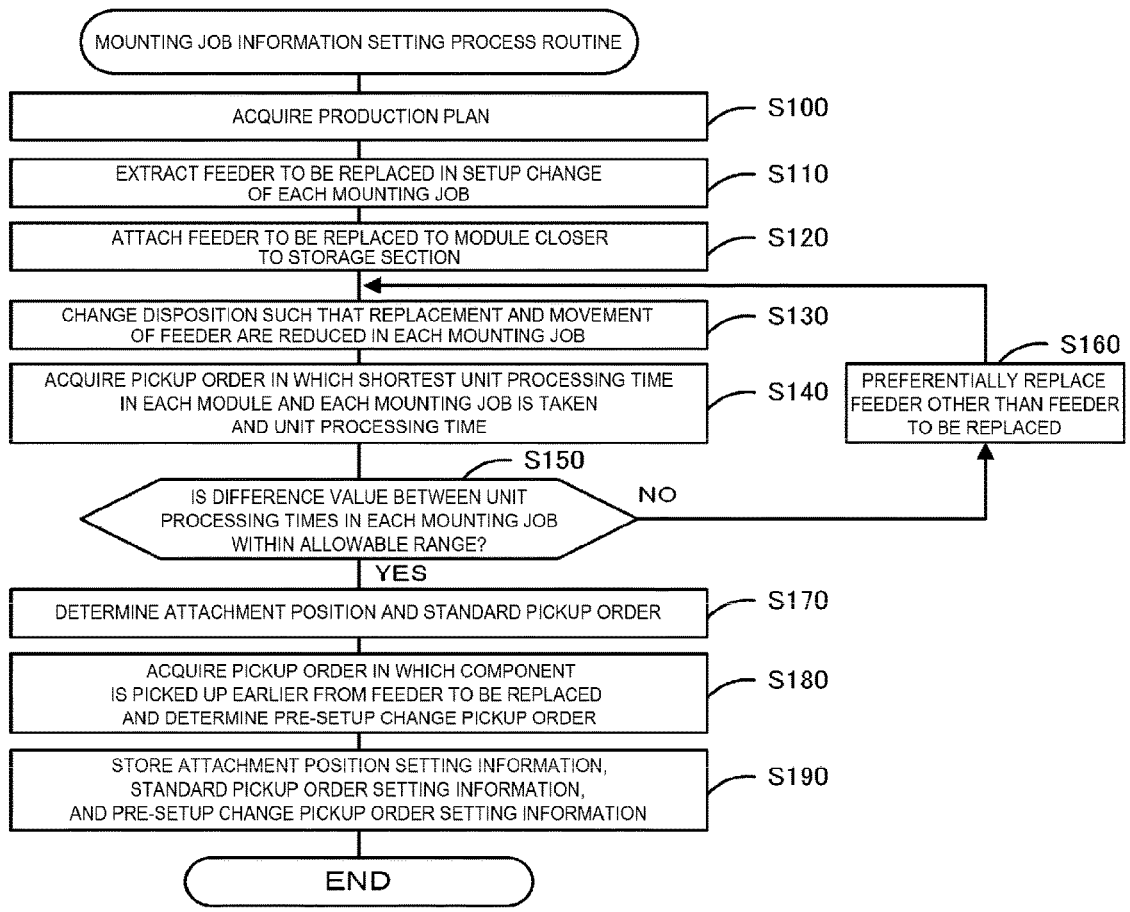
FIG. 3 is a flowchart illustrating an example of a mounting job information setting process routine.

Next, an operation of mounting system 10 according to the present embodiment configured as described above, particularly, a process in which host PC 19 sets mounting job information 71 will be described. FIG. 3 is a flowchart illustrating an example of a mounting job information setting process routine executed by CPU 61 included in management control section 60 of host PC 19. The mounting job information setting process routine is stored in memory section 63 of host PC 19, and is executed in response to a starting command from an operator when a production plan is created.

When the routine is started, CPU 61 reads and acquires production plan information 70 from memory section 63 (S100). Production plan information 70 is information including the type or the number of boards S to be produced, a position or the type of component to be mounted, the number of components, and the like, but an attachment position of feeder 17 holding a component, a component pickup order, a component disposition order, and the like are assumed to be set through a process described below, and are not set yet. Next, CPU 61 extracts feeder 17 required to be replaced in the setup changing operation of each mounting job based on the acquired information of production plan information 70 (S110). CPU 61 may extract feeder 17 required to be replaced by searching for feeder 17 that is no longer necessary and new feeder 17 that will be necessary in production switching in each mounting job. Next, CPU 61 sets an attachment position in a tendency for feeder 17 required to be replaced to be attached to an attachment portion of a module closer to storage section 13 (S120). Here, the "tendency to be attached to a closer attachment portion" indicates that feeder 17 required to be replaced is attached to a closer attachment portion as a whole although the presence of a feeder that cannot satisfy the tendency is partially allowed. Examples of a case where feeder 17 required to be replaced cannot be attached to a closer module include a case where mounting head 32 or nozzle 33 capable of pickup a component is not usable in mounting section 30, and a case where a mounting time required per board S (also referred to as unit processing time) greatly differs between modules and thus a module causing a bottleneck is generated in the mounting process. Feeder 17 requiring specific mounting head 32 or nozzle 33 is assigned to an attachment portion closer to storage section 13 among modules having mounting section 30 provided with feeder 17. In a case where feeder 17 required to be replaced exceeds a module closest to storage section 13, CPU 61 sets exceeding feeder 17 to an attachment position in an order of being closer to storage section 13, such as modules 2 and 3.

Next, CPU 61 changes an attachment position such that disposition in which replacement and movement of feeder 17 are reduced in each mounting job is obtained (S130). For example, in a case where multiple mounting jobs are continuously executed by mounting device 15, when component PA is continuously used in successive mounting jobs, if feeder 17 holding component PA is attached to the same attachment portion, it is unnecessary to replace and move feeder 17 in a setup changing operation. CPU 61 changes an attachment position of feeder 17 such that the number of feeders 17 on which replacement and movement of feeder 17 are not performed is increased. Next, CPU 61 acquires a pickup order and a disposition order in which the shortest unit processing time is taken when each mounting job is executed in each module, and the unit processing time (S140). The unit processing time per board may be calculated, for example, by obtaining a movement distance of mounting section 30, calculating a movement time from information such as the movement distance per unit time of mounting head 32 obtained empirically, and integrating these times. It is assumed that CPU 61 repeats a series of processes of selecting any module, obtaining a unit processing time by employing any pickup order in the module, obtaining a unit processing time by changing the pickup order of any feeder 17, further extracting any feeder 17, and changing an attachment position thereof to obtain a unit processing time for each module, and thus acquires the pickup order and the disposition order in which the shortest unit processing time is taken.

Subsequently, CPU 61 determines whether a difference value between the unit processing times of the modules in any one of the mounting jobs is within an allowable range (S150). Here, CPU 61 determines whether a module causing a bottleneck in the mounting process is generated because the unit processing times are greatly different between the respective modules. A value (for example, within several seconds, within 5 seconds, or the like) that allows board S to be conveyed smoothly may be empirically obtained and set as the allowable range. When the difference value is not within the allowable range, CPU 61 determines that an efficient mounting process is not possible, sets an attachment position at which any feeder 17 other than feeder 17 required to be replaced is preferentially replaced in another module (S160), and executes the processes in and after S130. Here, CPU 61 may select feeder 17 to be replaced between the modules, for example, by ascertaining a magnitude of the usage time of feeder 17 based on the number of components to be mounted or the like, and extracting a value at which difference values are averaged by changing the usage time. CPU 61 may repeatedly perform the processes in S130 to S160 for a predetermined time period, acquire multiple sets including attachment positions and unit processing times for which a difference value is within the allowable range, and select an attachment position set in which the shortest unit processing time is obtained from among the sets. On the other hand, when the difference value is within the allowable range in S150, CPU 61 determines the attachment position and also determines the set pickup order as a standard pickup order (S170).

Subsequently, CPU 61 acquires a pickup order having a tendency for a component to be picked up earlier from feeder 17 that is required to be replaced in the setup changing operation, and determines the acquired order as a pre-setup change pickup order (S180). When components are picked up in mounting device 15 in the pre-setup change pickup order, since the component supply is finished in order from feeder 17 required to be replaced, it is possible to start a setup changing operation for feeder 17 in parallel while performing the mounting process in mounting device 15. Here, the "tendency for the component to be picked up earlier from the feeder to be replaced" indicates that a component is picked up earlier from the feeder to be replaced as a whole although a feeder that cannot satisfy the tendency is partially allowed to be present. The determined attachment position, standard pickup order, and pre-setup change pickup order are respectively stored in attachment position setting information 72, standard pickup order setting information 73, and pre-setup change pickup order setting information 74 (S190), and this routine is finished. Through the processes, an attachment position of feeder 17 holding a component, an order in which components are picked up, a component disposition order, and the like are set in production plan information 70. CPU 61 transmits mounting job information 71 including attachment position setting information 72, standard pickup order setting information 73, and pre-setup change pickup order setting information 74 to storage section PC 14 or mounting device 15 at a predetermined timing. Storage section PC 14 that has received the information causes loader 18 to perform an operation of moving or providing feeder 17. Mounting device 15 that has received the information stores the information into memory section 23 as mounting job information 24, and mounting device 15 executes a mounting job based on mounting job information 24.

Figures 6, 7:
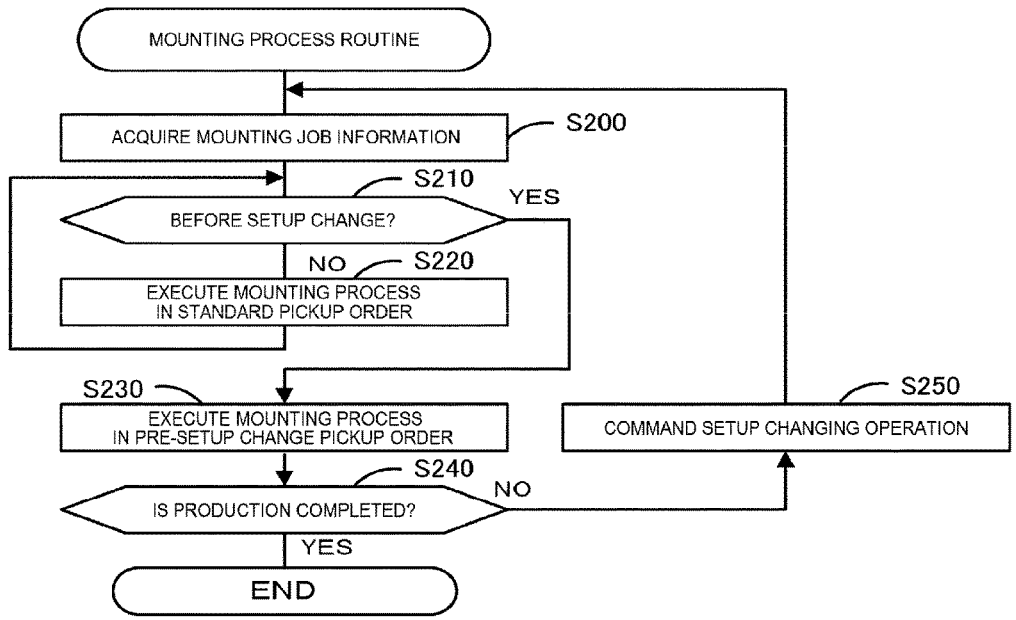
FIG. 6 is an explanatory diagram illustrating an example of setting of pre-setup change pickup order setting information 74.
FIG. 7 is a flowchart illustrating an example of a mounting process routine.

Here, the mounting job information setting process described above will be described by using a specific example. FIG. 4 is an explanatory diagram illustrating an example of an outline of setting of the attachment position and the pre-setup change pickup order, in which FIG. 4A illustrates an initial state, FIG. 4B illustrates a production plan after creation of attachment position setting information 72, and FIG. 4C illustrates a production plan after creation of pre-setup change pickup order setting information 74. FIG. 5 is an explanatory diagram illustrating an example of setting of attachment position setting information 72. FIG. 6 is an explanatory diagram illustrating an example of setting of pre-setup change pickup order setting information 74. Here, for better understanding, a description will be made by using a relatively simple production plan. As illustrated in FIG. 4, a case where three sets of components PA to PK and attachment portions 1 to 6 of modules 1 to 3 are used, and modules 1, 2, and 3 of supply section 27 are assumed to be closer to storage section 13 in this order, and production of board S is performed in the order of mounting jobs 1, 2, and 3 will be described with reference to FIGS. 4 to 6 as a specific example. In mounting job 2, it is assumed that component PD is replaced with component PG and component PF is replaced with component PH, and, in mounting job 3, component PC is replaced with component PJ and component PH is replaced with component PK. In FIGS. 4A to 4C, a component type to be replaced in the setup changing operation is hatched.

First, CPU 61 extracts a component required to be replaced from the initial state illustrated in FIG. 4A (S110), and sets an attachment position such that the component is attached to module 1 that is as close to storage section 13 as possible (S120). Here, CPU 61 extracts components PD, PF, PC, and PH, and sets the components to be attached to module 1. Here, since all the components to be replaced cannot be attached to module 1, for example, as illustrated in FIG. 4B, components PG and PH are assigned to module 2 according to a unit processing time or the like (S150 and S160). CPU 61 also adjusts an attachment portion in mounting job 1 based on mounting jobs 3 and 2 such that replacement and movement of feeder 17 do not occur in the production switching (S130). For example, as illustrated in FIG. 4B, in modules 2 and 3, components PA, PB, and the like are all left attached to the same attachment portion. In the above-described way, CPU 61 causes feeder 17 required to be replaced in the setup changing operation to be disposed at a position as close to storage section 13 as possible while suppressing useless replacement and movement of feeder 17. Generally, in mounting system 10, twenty to thirty mounting devices 15 may be arranged, and thus a long movement time may be required when loader 18 tries to replace feeder 17 in the farthest module. In mounting system 10, since a movement distance of such loader 18 can be shortened, it is possible to further reduce a movement time of loader 18.

When the mounting order illustrated in FIG. 4B and the left part of FIG. 6 has the highest mounting efficiency, CPU 61 creates mounting job information 71 that causes mounting device 15 to execute a component mounting process in the mounting order. With respect to last board S in the mounting job, CPU 61 causes components to be picked up in order from feeders 17 to be replaced in the setup changing operation, as illustrated in FIG. 4C and the right part of FIG.

6. For example, as illustrated in FIG. 6, in a mounting process based on standard pickup order setting information 73, in module 1, loader 18 cannot start replacement of feeder 17 unless pickup of component PD in mounting order 3 is completed. On the other hand, in a mounting process based on pre-setup change pickup order setting information 74, in module 1, when pickup of component PD in mounting order 1 is finished, the component supply from feeder 17 is finished, and thus loader 18 can immediately replace feeder 17. As described above, host PC 19 can change a component pickup order to pre-setup change pickup order setting information 74 at the time of mounting process for the last board, and thus the setup changing operation can be started earlier.

Next, an operation of loader 18 will be described. When mounting job information 71 created by host PC 19 is acquired, storage section PC 14 gives a command for operation details to loader 18. Loader 18 executes an operation such as movement or replacement of feeder 17 in response to a command from storage section PC 14. Loader 18 is moved to and from storage section 13 temporarily storing feeder 17, recovers feeder 17 from the supply section 27, or provides feeder 17 to the supply section 27. In this case, loader 18 attaches feeder 17 to be replaced in association with the production switching to an attachment portion closer to storage section 13 based on the attachment position setting information. For example, before mounting job 1 is started, loader 18 causes feeders 17 holding components PC, PC, PD, PD, PF, and PF to be attached to attachment portion Nos. 1 to 6 of module 1, respectively (FIG. 4B). Similarly, corresponding feeders 17 are attached to attachment portions of module 2 and the subsequent modules. Loader 18 executes a setup changing operation for feeder 17 in parallel with a mounting process for the last board in mounting job 1.

Next, a mounting process of mounting device 15 using mounting job information 24 will be described. FIG. 7 is a flowchart illustrating an example of a mounting process routine executed by CPU 21 of mounting control section 20. The mounting process routine is stored in memory section 23 of mounting device 15 and is executed in response to a starting command from an operator. When this routine is started, CPU 21 acquires mounting job information 24 from host PC 19 (S200), and determines whether a mounting process is performed immediately before setup change, that is, whether the mounting process is a mounting process for the last board in a mounting job (S210). When the mounting process is not performed immediately before the setup change, CPU 21 executes a mounting process in a standard pickup order based on the standard pickup order setting information (S220), and executes the processes in and after S210. On the other hand, when the mounting process is performed immediately before the setup change in S210, CPU 21 executes a mounting process in a pre-setup change pickup order based on the pre-setup change pickup order setting information (S230). That is, in the mounting process for the last board, CPU 21 causes components to be mounted in the pre-setup change pickup order determined in a tendency for a component to be picked up earlier from feeder 17 to be replaced in association with the production switching. Subsequently, CPU 21 determines whether production of board S is entirely completed (S240), and, when the production of board S is not completed, commands storage section PC 14 to start the setup changing operation (S250), and executes the processes in and after S200. The process in S250 is performed at the same time as the mounting process in S230 to be performed in parallel with the setup changing operation. On the other hand, when the entire production of board S is completed in S250, the routine is finished.

Here, a correspondence relationship between the constituent elements of the present embodiment and the constituent elements of the present disclosure will be clarified. Mounting device 15 of the present embodiment corresponds to a mounting device, host PC 19 corresponds to a management device, and loader 18 corresponds to a moving work device. Management control section 60 corresponds to a management control section, supply section 27 corresponds to a supply section, mounting attachment portion 28 corresponds to an attachment portion, mounting section 30 corresponds to a mounting section, and mounting control section 20 corresponds to a mounting control section. Board S corresponds to a mounting target. In the present embodiment, an example of a management method of the present disclosure is also clarified by describing the operation of management control section 60.

In mounting system 10 described above, host PC 19 sets attachment position setting information 72 including an attachment position of feeder 17 based on production plan information 70, including multiple pieces of mounting job information 71, before setting of an attachment position, a pickup order, and a disposition order such that a tendency for feeder 17 to be replaced in association with production switching to be attached to an attachment portion closer to storage section 13 that stores feeder 17 is achieved. Loader 18 performs an operation of moving feeder 17 to and from storage section 13 based on attachment position setting information 72 during production switching. In this case, since feeder 17 to be replaced in association with the production switching is present at a position closer to storage section 13, a movement distance of loader 18 can be further shortened, and thus the time required to exchange feeders 17 can be further reduced. Therefore, in host PC 19, it is possible to execute the setup changing operation associated with the production switching with higher efficiency.

Mounting system 10 includes supply section 27 that is managed in the unit of a module including multiple attachment portions, and management control section 60 sets attachment position setting information 72 in a tendency for feeder 17 to be replaced in association with production switching to be attached to an attachment portion of a module closer to the storage section. In host PC 19, an attachment position of feeder 17 is set in the module unit, and thus it is possible to execute a setup changing operation associated with production switching with higher efficiency. Management control section 60 sets mounting job information 71 including an order of pickup a component from feeder 17 in a tendency for a component to be picked up earlier from feeder 17 to be replaced in association with production switching. In host PC 19, since feeder 17 to be replaced during production switching finishes the component supply in earlier timing, which makes it possible to execute the setup changing operation even when another feeder 17 is supplying a component. Therefore, since host PC 19 can execute feeder setup change in parallel with the mounting process, it is possible to execute the setup changing operation with higher efficiency. In a final mounting process of mounting components on last board S in production, management control section 60 uses the pre-setup change pickup order that is set in a tendency for a component to be picked up earlier from feeder 17 to be replaced in association with at least production switching. In this host PC 19, since the supply of a component from feeder 17 to be replaced in setup change is finished during the mounting process for at least last board S, it is possible to employ a standard pickup order having a higher mounting efficiency in other boards S, and it is also possible to further improve the efficiency in the production as a whole.

Since mounting system 10 includes host PC 19, mounting device 15, and loader 18 described above, it is possible to execute the setup changing operation associated with production switching with higher efficiency. Since loader 18 attaches feeder 17 to be replaced in association with production switching an attachment portion closer to storage section 13, a movement distance thereof can be further shortened, and thus the time required to exchange feeders 17 can be further reduced. Therefore, loader 18 can execute the setup changing operation associated with production switching with higher efficiency. When mounting section 30 picks up a component from feeder 17 based on mounting job information 24, mounting device 15 performs a component mounting process according to a pre-setup change pickup order determined in a tendency for a component to be picked up earlier from feeder 17 to be replaced in association with production switching. In mounting device 15, since the mounting process is performed in the pre-setup change pickup order, feeder 17 to be replaced during production switching finishes the supply of a component in earlier timing, and thus setup change can be performed even while another feeder 17 is supplying a component. In mounting device 15, since feeder setup change can be executed in parallel with the mounting process, it is possible to execute the setup changing operation associated with production switching with higher efficiency.

It is obvious that the present disclosure is not limited to the above-described embodiment and can be implemented in various aspects as long as the aspects belong to the scope of the present disclosure.

For example, in the above embodiment, mounting device 15 has supply section 27 managed in the unit of a module including multiple attachment portions, and attachment of feeder 17 is set in the module unit; however, the configuration is not particularly limited to this, and an attachment position may be set without considering the module. Also in this mounting system 10, it is possible to execute the setup changing operation associated with production switching with higher efficiency.

In the above embodiment, the pre-setup change pickup order that is set in a tendency for a component to be picked up earlier from feeder 17 to be replaced in association with production switching is used during a mounting process for the last board; however, the configuration is not limited to the last board, and the pre-setup change pickup order may be used for a predetermined number (for example, five, or ten) of boards before the last board, or the pre-setup change pickup order may be used during a mounting process for all boards S. Also in this mounting system 10, it is possible to execute the setup changing operation associated with production switching with higher efficiency. Alternatively, in the above embodiment, the pre-setup change pickup order that is set in a tendency for a component to be picked up earlier from feeder 17 to be replaced in association with production switching is used, but this may be omitted. Also in this mounting system 10, since feeder 17 to be replaced in association with production switching is attached to an attachment portion closer to storage section 13, it is possible to execute the setup changing operation associated with the production switching with higher efficiency.

In the above embodiment, production plan information 70 has been described as including mounting job information 71, attachment position setting information 72, standard pickup order setting information 73, and pre-setup change pickup order setting information 74; however, the configuration is not particularly limited to this, and the pieces of information may be stored separately. Each of the pieces of information may be stored in any memory section, and a management state thereof is freely selected. For example, production plan information 70 may include only information including an outline of a production plan, for example, the type or the number of boards S to be produced, a position or the type of component to be mounted, and the number of components, and may be information stored in a lower-rank portion in association with mounting job information 71. One or more of attachment position setting information 72, standard pickup order setting information 73, and pre-setup change pickup order setting information 74 may also be information stored in association with mounting job information 71.

In the above embodiment, mounting system 10 includes printing device 11, print inspection device 12, storage section 13, storage section PC 14, and mounting device 15; however, the configuration is not particularly limited to this, and one or more of the above devices may be omitted, or a device (for example, a reflow device) other than the above devices may be added.

In the above embodiment, host PC 19 has been described as creating attachment position setting information 72, standard pickup order setting information 73, and pre-setup change pickup order setting information 74; however, the configuration is not particularly limited to this, and other devices such as storage section PC 14, mounting device 15, and loader 18 may create such information.

In the above embodiment, the present disclosure is applied to the form of mounting system 10, but the present disclosure may be applied to host PC 19 (management device), loader 18 (moving work device), mounting device 15, a management method, and a program causing a computer to execute the management method.

Here, the management device, the moving work device, the mounting device, the mounting system, and the management method of the present disclosure may be configured as follows. For example, in the management device of the present disclosure, the mounting system may include the supply section managed in the unit of a module including the multiple attachment portions, and the management control section may set the attachment position setting information in a tendency for a feeder to be replaced in association with production switching to be attached to an attachment portion of the module closer to the storage section. In this management device, an attachment position of the feeder is set in the module unit, and thus it is possible to execute a setup changing operation associated with production switching with higher efficiency.

In the management device of the present disclosure, the management control section may set the mounting condition information including an order of pickup the component from the feeder in a tendency for the component to be picked up earlier from the feeder to be replaced in association with the production switching. In this management device, since the feeder to be replaced during production switching finishes the supply of the component in earlier timing, setup change can be performed even while another feeder 17 is supplying a component. Thus, in the management device, since feeder setup change can be executed in parallel with a mounting process, it is possible to execute a setup changing operation associated with production switching with higher efficiency. Here, the "tendency for the component to be picked up earlier from the feeder to be replaced" indicates that a component is picked up earlier from the feeder to be replaced as a whole although a feeder that cannot satisfy the tendency is partially allowed to be present.

Alternatively, the management device of the present disclosure is a management device used in a mounting system including a mounting device including a mounting section configured to mount a component on a mounting target, a supply section having an attachment portion to which a feeder holding the component is attached, and a mounting control section configured to cause the mounting section to pick up the component from the feeder based on mounting condition information, and a moving work device including a movement control section configured to recover the feeder from the supply section or provide the feeder to the supply section and move the feeder to and from a storage section, and includes a management control section configured to set the mounting condition information including an order of pickup the component from the feeder in a tendency for the component to be picked up earlier from the feeder to be replaced in association with production switching.

In this management device, the mounting condition information including an order of pickup the component from the feeder in the tendency for the component to be picked up earlier from the feeder to be replaced in association with production switching is set. In the mounting device, since the mounting process is performed by using the mounting condition information, the feeder to be replaced during production switching finishes the component supply earlier, and thus setup change can be performed even while another feeder is supplying a component. Therefore, in the management device, since feeder setup change can be executed in parallel during the mounting process, it is possible to execute a setup changing operation associated with production switching with higher efficiency.

In the management device of the present disclosure that sets the mounting condition information including a pickup order, the management control section may set the pickup order in a tendency for the component to be picked up from the feeder to be replaced in association with at least production switching in a final mounting process of mounting the component on the last mounting target in production. In this management device, since the component supply is finished from the feeder to be replaced in the setup change during the mounting process for at least the last mounting target, it is possible to employ a pickup order having a higher mounting efficiency in other mounting targets, and it is also possible to further improve the efficiency in the entire production.

The mounting system of the present disclosure includes a mounting device including a mounting section configured to mount a component on a mounting target, a supply section having an attachment portion to which a feeder holding the component is attached, and a mounting control section configured to cause the mounting section to pick up the component from the feeder based on mounting condition information, a moving work device including a movement control section configured to recover the feeder from the supply section or provide the feeder to the supply section and move the feeder to and from a storage section, and any one of the above management devices. Since the mounting system includes the management device or the mounting device described above, it is possible to execute a setup changing operation associated with production switching with higher efficiency.

The moving work device of the present disclosure is a moving work device used in a mounting system including a mounting device including a mounting section configured to mount a component on a mounting target, a supply section having an attachment portion to which a feeder holding the component is attached, and a mounting control section configured to cause the mounting section to pick up the component from the feeder based on mounting condition information, and includes a movement control section configured to recover the feeder from the supply section or provide the feeder to the supply section and move the feeder to and from a storage section, and configured to attach the feeder to be replaced in association with production switching to an attachment portion closer to the storage section.

The moving work device recovers the feeder from the supply section or provides the feeder to the supply section, and moves the feeder to and from the storage section that temporarily stores the feeder. On the other hand, the moving work device attaches the feeder to be replaced in association with production switching to an attachment portion closer to the storage section. As described above, since the feeder to be replaced in association with the production switching is present at a position closer to the storage section, a movement distance of the moving work device can be further shortened, and thus, the time required to exchange feeders can be further reduced. Therefore, in the moving work device, it is possible to execute a setup changing operation associated with production switching with higher efficiency. In the moving work device, various aspects of the management device described above may be employed, or steps for realizing each function of the management device described above may be added.

The mounting device of the present disclosure is a mounting device used in a mounting system including a moving work device including a movement control section configured to recover a feeder holding a component from a supply section or provide the feeder to the supply section and move the feeder to and from a storage section, and includes a mounting section configured to mount the component on a mounting target, the supply section having an attachment portion to which the feeder holding the component is attached, and a mounting control section configured to cause the component to be mounted according to an order of pickup the component from the feeder, defined in a tendency for the component to be picked up earlier from the feeder to be replaced in association with production switching when the mounting section picks up the component from the feeder based on mounting condition information.

In this mounting device, the component is mounted according to an order of pickup the component from the feeder, defined in a tendency for the component to be picked up earlier from the feeder to be replaced in association with production switching when the mounting section picks up the component from the feeder based on mounting condition information. In the mounting device, since the mounting process is performed in this pickup order, the feeder to be replaced during production switching finishes the component supply earlier, and thus setup change can be performed even while another feeder is supplying a component. Therefore, in this mounting device, since feeder setup change can be executed in parallel during the mounting process, it is possible to execute a setup changing operation associated with production switching with higher efficiency. In the mounting device, various aspects of the management device described above may be employed, or steps for realizing each function of the management device described above may be added.

The management method of the present disclosure includes a management method used in a mounting system including a mounting device including a mounting section configured to mount a component on a mounting target, a supply section having an attachment portion to which a feeder holding the component is attached, and a mounting control section configured to cause the mounting section to pick up the component from the feeder based on mounting condition information, and a moving work device including a movement control section configured to recover the feeder from the supply section or provide the feeder to the supply section and move the feeder to and from a storage section, and includes a step of setting attachment position setting information including an attachment position of the feeder in a tendency for the feeder to be replaced in association with production switching to be attached to an attachment portion closer to the storage section based on production plan information including multiple pieces of the mounting condition information.

In this management method, similarly to the management device described above, since the feeder to be replaced in association with the production switching is present at a position closer to the storage section, a movement distance of the moving work device can be further shortened, and thus, the time required to exchange feeders can be further reduced. Accordingly, in the management method, it is possible to execute a setup changing operation associated with production switching with higher efficiency. In the management method, various aspects of the management device described above may be employed, or steps for realizing each function of the management device described above may be added.

INDUSTRIAL APPLICABILITY

The present disclosure is applicable to the technical field of devices that pick up and mount components.

REFERENCE SIGNS LIST

10 Mounting system, 11 Printing device, 12 Print inspection device, 13 Storage section, 14 Storage section PC, 15 Mounting device, 16 Automatic conveyance vehicle, 17 Feeder, 18 Loader, 18*a* X-axis rail, 19 Host PC, 20 Mounting control section, 21 CPU, 23 Memory section, 24 Mounting job information, 26 Board processing section, 27 Supply section, 28 Mounting attachment portion, 29 Buffer attachment portion, 30 Mounting section, 31 Head movement portion, 32 Mounting head, 33 Nozzle, 35 Communication section, 38 Slot, 39 Connection part, 50 Movement control section, 51 CPU, 53 Memory section, 54 Accommodation section, 55 Exchange section, 56 Movement section, 57 Communication section, 60 Management control section, 61 CPU, 63 Memory section, 67 Communication section, 68 Display section, 69 Input device, 70 Production plan information, 71 Mounting job information, 72 Attachment position setting information, 73 Standard pickup order setting information, 74 Pre-setup change pickup order setting information, PA to PK Component, S Board

The invention claimed is:

1. A management device that is used in a mounting system including a mounting device including: a mounting section configured to mount a component on a mounting target; a supply section having an attachment portion to which at least one feeder holding the component is attached, and a mounting control section configured to cause the mounting section to pick up the component from the feeder based on mounting condition information, and a moving work device including a movement control section configured to move the feeder to and from a storage section so as to recover the feeder from the supply section or provide the feeder to the supply section, the management device comprising:
a management control section configured to
acquire production plan information,
extract a feeder to be replaced in a setup changing operation of each mounting job based on the acquired production plan information,
set attachment position setting information, including an attachment position of the feeder, based on the production plan information, including multiple pieces of the mounting condition information, in a tendency such that the feeder to be replaced is attached to an attachment portion that is closer to the storage section,
change the attachment position of the feeder to reduce replacement and movement of the feeder in each mounting job,
acquire a pickup order and a disposition order in which a shortest unit processing time is taken when each mounting job is executed,
determine the attachment position when the unit processing time is within an allowable range, and
store the determined attachment position.

2. The management device according to claim 1, wherein the mounting system has the supply section managed in a unit of a module including multiple attachment portions, and the management control section sets the attachment position setting information in a tendency for the feeder to be replaced in association with the production switching to be attached to the attachment portion of the module closer to the storage section.

3. The management device according to claim 1, wherein the management control section sets the pickup order in a tendency for the component to be picked up earlier from the feeder to be replaced in association with at least the production switching in a final mounting process of mounting the component on the last mounting target in production.

4. A mounting system comprising:
a mounting device including a mounting section configured to mount a component on a mounting target, a supply section having an attachment portion to which a feeder holding the component is attached, and a mounting control section configured to cause the mounting section to pick up the component from the feeder based on mounting condition information;
a moving work device including a movement control section configured to recover the feeder from the supply section or provide the feeder to the supply section and move the feeder to and from a storage section; and
the management device according to claim 1.

5. A management method that is used in a mounting system including a mounting device including a mounting section configured to mount a component on a mounting target, a supply section having an attachment portion to which at least one feeder holding the component is attached, and a mounting control section configured to cause the mounting section to pick up the component from the feeder based on mounting condition information, and a moving work device including a movement control section configured to recover the feeder from the supply section or provide the feeder to the supply section and move the feeder to and from a storage section, the management method comprising:
acquiring production plan information;
extracting a feeder to be replaced in a setup changing operation of each mounting job based on the acquired production plan information;

setting attachment position setting information including an attachment position of the feeder, based on the production plan information, including multiple pieces of the mounting condition information, in a tendency such that the feeder to be replaced is attached to an attachment portion closer to the storage section;

changing the attachment position of the feeder to reduce replacement and movement of the feeder in each mounting job, acquiring a pickup order and a disposition order in which a shortest unit processing time is taken when each mounting job is executed, determining the attachment position when the unit processing time is within an allowable range, and storing the determined attachment position.

* * * * *